United States Patent
Yamahira

(10) Patent No.: US 7,969,231 B2
(45) Date of Patent: Jun. 28, 2011

(54) INTERNAL VOLTAGE GENERATING CIRCUIT

(75) Inventor: Seiji Yamahira, Kyoto (JP)

(73) Assignee: Panasonic Corporation, Osaka (JP)

( * ) Notice: Subject to any disclaimer, the term of this patent is extended or adjusted under 35 U.S.C. 154(b) by 22 days.

(21) Appl. No.: 12/497,090

(22) Filed: Jul. 2, 2009

(65) Prior Publication Data
US 2010/0007408 A1 Jan. 14, 2010

(30) Foreign Application Priority Data

Jul. 9, 2008 (JP) ................................ 2008-179566

(51) Int. Cl.
*G05F 1/10* (2006.01)
(52) U.S. Cl. ....................................................... 327/536
(58) Field of Classification Search .................. 327/535, 327/536, 537
See application file for complete search history.

(56) References Cited

U.S. PATENT DOCUMENTS

| | | | |
|---|---|---|---|
| 5,940,284 A | 8/1999 | Troutman | |
| 5,999,475 A | 12/1999 | Futatsuya et al. | |
| 6,249,445 B1 | 6/2001 | Sugasawa | |
| 6,278,317 B1 * | 8/2001 | Hsu et al. | 327/536 |
| 6,980,045 B1 * | 12/2005 | Liu | 327/536 |
| 7,579,902 B2 * | 8/2009 | Frulio et al. | 327/536 |
| 7,592,856 B2 * | 9/2009 | Ito et al. | 327/536 |
| 7,605,639 B2 * | 10/2009 | Gou | 327/536 |
| 7,782,120 B2 * | 8/2010 | Kim et al. | 327/535 |
| 2004/0095806 A1 | 5/2004 | Osawa et al. | |
| 2007/0222498 A1 | 9/2007 | Choy et al. | |

* cited by examiner

*Primary Examiner* — Jeffrey S Zweizig
(74) *Attorney, Agent, or Firm* — McDermott Will & Emery LLP

(57) ABSTRACT

An output terminal of a first boost circuit is connected to a second boost circuit. After the second boost circuit is started up, a boost clock frequency of the second boost circuit is reduced. A time required to start up the second boost circuit is reduced, and in addition, a current supply capability of the first boost circuit is increased after the second boost circuit is started up. When the second boost circuit is driven, output voltages of the first and second boost circuits are stably supplied without instantaneously changing the output voltage of the first boost circuit.

8 Claims, 8 Drawing Sheets

INTERNAL VOLTAGE GENERATING CIRCUIT

CROSS REFERENCE TO RELATED APPLICATIONS

This application claims priority under 35 U.S.C. §119(a) on Patent Application No. 2008-179566 filed in Japan on Jul. 9, 2008, the entire contents of which are hereby incorporated by reference.

BACKGROUND

The present disclosure relates to an internal voltage generating circuit employing a boost circuit.

In recent years, flash memories, which are non-volatile semiconductor memory devices, require data read operation and data write operation which are performed using a single power source voltage or a low power source voltage. To achieve this, a boost circuit for supplying a boosted voltage or a negative boosted voltage during each operation is required on a chip. Also, in CMOS processes, a voltage generated by a boost circuit is used as a power source to improve characteristics of an analog circuit.

FIG. 9 shows a configuration of an internal voltage generating circuit 900 which is disclosed in U.S. Pat. No. 5,999,475. The internal voltage generating circuit 900 includes a first boost circuit 901 which performs boost operation in synchronization with a clock signal CLK and a complementary clock signal XCLK to output a first boosted voltage VPUMP1 through a first output node N1, a second boost circuit 902 which similarly performs boost operation in synchronization with the clock signals CLK and XCLK to output a second boosted voltage VPUMP2 through a second output node N2, and a high voltage switch circuit 903 which causes a path between the first output node N1 and the second output node N2 to be in the conductive or non-conductive state.

The first boost circuit 901 includes a first high voltage detecting circuit 904 which, when a first control signal PPE1 is activated, detects a voltage level of the first boosted voltage VPUMP1 and sets a first sense signal CKE1 to be in the active or inactive state, a first CLK gate circuit 905 which outputs the clock signals CLK and XCLK as first boost clock signals PCK1 and XPCK1 in response to the first sense signal CKE1, and a first charge pump circuit 906 which performs boost operation in synchronization with the first boost clock signals PCK1 and XPCK1 to output the first boosted voltage VPUMP1 through the first output node N1.

The second boost circuit 902 includes a second high voltage detecting circuit 907 which, when a second control signal PPE2 is activated, detects a voltage level of the second boosted voltage VPUMP2 and sets a second sense signal CKE2 to be in the active or inactive state, a second CLK gate circuit 908 which outputs the clock signals CLK and XCLK as second boost clock signals PCK2 and XPCK2 in response to the second sense signal CKE2, and a second charge pump circuit 909 which performs boost operation in synchronization with the second boost clock signals PCK2 and XPCK2 to output the second boosted voltage VPUMP2 through the second output node N2.

The high voltage switch circuit 903 is controlled in accordance with a control signal XPPE1 complementary to the first control signal PPE1 and a sense signal XCKE1 complementary to the first sense signal CKE1. When the operation of the internal voltage generating circuit 900 is started, the high voltage switch circuit 903 causes a path between the first output node N1 and the second output node N2 to be in the conductive state. After a voltage level of the first output node N1 becomes at a predetermined voltage level, the high voltage switch circuit 903 causes the path between the first output node N1 and the second output node N2 to be in the non-conductive state.

FIG. 10 shows details of the first charge pump circuit 906. The first charge pump circuit 906 includes boost capacitances Ca1 to Ca4 which are boosted in synchronization with the first boost clock signals PCK1 and XPCK1, charge transfer transistors Ta1 to Ta4 which transfer boosted charge from the previous stage to the next stage, and a backflow preventing circuit Ta5 which prevents backflow of charge of the first output node N1 (four-stages-one-parallel arrangement).

FIG. 11 shows details of the second charge pump circuit 909. The second charge pump circuit 909 includes boost capacitances Cb1 to Cb6 which are boosted in synchronization with the second boost clock signals PCK2 and XPCK2, charge transfer transistors Tb1 to Tb6 which transfer boosted charge from the previous stage to the next stage, and a backflow preventing circuit Tb7 which prevents backflow of charge of the second output node N2 (six-stages-one-parallel arrangement).

Here, the first and second charge pump circuits 906 and 909 receive a power source voltage VDD through first and second input terminals NIN1 and NIN2 and generate the first and second boosted voltages VPUMP1 and VPUMP2, respectively. Output voltages and output currents of the first and second charge pump circuits 906 and 909 are assumed to have the following relationships. Specifically, it is assumed that the boosted voltage VPUMP1 of the first charge pump circuit 906 is lower than the boosted voltage VPUMP2 of the second charge pump circuit 909, and a current supply capability IPUMP1 of the first charge pump circuit 906 is larger than a current supply capability IPUMP2 of the second charge pump circuit 909. Moreover, for example, it is assumed that the boost capacitances Ca1 to Ca4 of the first charge pump circuit 906 each have a capacitance value of 5 pF, and the boost capacitances Cb1 to Cb6 of the second charge pump circuit 909 each have a capacitance value of 1 pF.

FIG. 12 shows operational waveforms in FIGS. 9 to 11. The boost operation will be briefly described with reference to FIG. 12.

(Time T0)

An initial state of the circuit is shown. Both the first control signal PPE1 and the second control signal PPE2 are at "L."

(Time T1)

At time T1, the first control signal PPE1 transitions from "L" to "H." In this case, the first boosted voltage VPUMP1 at the first output node N1 has not reached a first target voltage VPP1_TARGET, and therefore, the first high voltage detecting circuit 904 outputs "L" as the first sense signal CKE1. As a result, the first CLK gate circuit 905 outputs the clock signals CLK and XCLK as the first boost clock signals PCK1 and XPCK1, and the first charge pump circuit 906 starts the boost operation in synchronization with the first boost clock signals PCK1 and XPCK1.

Similarly, the second control signal PPE2 transitions from "L" to "H." In this case, the second boosted voltage VPUMP2 at the second output node N2 also has not reached a second target voltage VPP2_TARGET, and therefore, the second high voltage detecting circuit 907 outputs "L" as the second sense signal CKE2. As a result, the second CLK gate circuit 908 outputs the clock signals CLK and XCLK as the second boost clock signals PCK2 and XPCK2, and the second charge pump circuit 909 starts the boost operation in synchronization with the second boost clock signals PCK2 and XPCK2.

Thus, since the first sense signal CKE1 is at "L," the sense signal XCKE1 complementary to this is at "H," and therefore, the high voltage switch circuit 903 is in the conductive state. As a result, charging of the first output node N1 and the second output node N2 is started by the first charge pump circuit 906 and the second charge pump circuit 909.

(Time T2)

At time T2, while the high voltage switch circuit 903 remains in the conductive state, the first output node N1 and the second output node N2 are charged at the same rate by the first charge pump circuit 906 and the second charge pump circuit 909.

(Time T3)

At time T3, when the first boosted voltage VPUMP1 has reached the first target voltage VPP1_TARGET, the first sense signal CKE1 of the first high voltage detecting circuit 904 transitions from "L" to "H," and the first CLK gate circuit 905 fixes the first boost clock signal PCK1 to "L" and its complementary signal XPCK1 to "H." As a result, the boost operation of the first charge pump circuit 906 is stopped, and at the same time, the high voltage switch circuit 903 transitions from the conductive state to the non-conductive state, so that the first output node N1 and the second output node N2 are disconnected.

During a "Phase1" period from time T1 to time T3 that the high voltage switch circuit 903 is in the conductive state, the second output node N2 of the second charge pump circuit 909 having the low current supply capability IPUMP2 is rapidly charged to the first target voltage VPP1_TARGET by the first charge pump circuit 906 having the high current supply capability IPUMP1. At time T3, the internal voltage generating circuit 900 transitions from the "Phase 1" period to a "Phase2" period during which the high voltage switch circuit 903 is in the non-conductive state, and the first charge pump circuit 906 and the second charge pump circuit 909 operate independently of each other. Thereafter, Phase 2 continues.

(Time T4)

At time T4, the second output node N2 is charged using only the second charge pump circuit 909 which has the boost capacitances Cb1 to Cb6 (=1 pF) which are ⅕ of the first boost capacitances Ca1 to Ca4 (=5 pF) of the first charge pump circuit 906. At time T5, the second output node N2 reaches the second target voltage VPP2_TARGET. During Phase2 that the second output node N2 is charged using only the second charge pump circuit 909 having the low current supply capability IPUMP2, a change in voltage per unit time at the second output node N2 is smaller than that during Phase1.

Thereafter, the logic of the first sense signal CKE1 is inverted, depending on the voltage level of the first output node N1, and the logic of the second sense signal CKE2 is inverted, depending on the voltage level of the second output node N2. Thus, the first charge pump circuit 906 and the second charge pump circuit 909 repeatedly perform intermittent operation to hold the respective voltage levels.

As described above, the first output node N1 of the first charge pump circuit 906 having the high current supply capability IPUMP1 and the second output node N2 of the second charge pump circuit 909 having the low current supply capability IPUMP2 are controlled into the conductive/non-conductive state by the high voltage switch circuit 903. As a result, a voltage setup time for the second output node N2 of the second charge pump circuit 909 having the low current supply capability IPUMP2 can be reduced while preventing an increase in area of the internal voltage generating circuit 900.

SUMMARY

In the conventional internal voltage generating circuit 900, the second boost capacitances Cb1 to Cb6 of FIG. 11 may be increased only for the purpose of reducing the setup time of the second charge pump circuit 909 during Phase2, which disadvantageously increasing the number of circuits having poor use efficiency. Moreover, when the second boost capacitances Cb1 to Cb6 are increased so as to reduce the setup time, a smoothing capacitance is required at the second output node N2 of the second charge pump circuit 909 so as to prevent a ripple at the second output node N2, which disadvantageously increases the circuit area.

An overview of representative embodiments of the present disclosure will be briefly described as follows.

According to an aspect of the present disclosure, an internal voltage generating circuit includes a first boost circuit provided between a first voltage and a first terminal, a second boost circuit provided between the first terminal and a second terminal, a frequency dividing circuit configured to divide a first clock signal to be supplied to the first boost circuit to generate a second clock signal, and a buffer circuit configured to select and supply the first clock signal or the second clock signal to the second boost circuit.

According to another aspect of the present disclosure, an internal voltage generating circuit includes a first charge pump circuit configured to generate a second voltage from a first voltage, a second charge pump circuit configured to generate a third voltage from the second voltage, a frequency dividing circuit configured to divide a first clock signal to generate a second clock signal, and a buffer circuit configured to select the first clock signal or the second clock signal and generate a third clock signal. The third clock signal is supplied to the second charge pump circuit.

According to still another aspect, an internal voltage generating circuit includes a first charge pump circuit configured to generate a second voltage from a first voltage, and a second charge pump circuit configured to generate a third voltage from the second voltage. A frequency of a clock signal to be supplied to the second charge pump circuit is changed in accordance with a control signal.

According to the internal voltage generating circuit of the present disclosure, a boosted voltage of the first charge pump circuit in the first boost circuit is used as an input voltage to the second charge pump circuit having a low current supply capability in the second boost circuit. Each charge pump circuit is controlled by a high voltage detecting circuit. Moreover, by dividing a boost clock signal to be supplied to the second charge pump circuit, the setup time of the second charge pump circuit can be reduced. After the second charge pump circuit is set up, current supply can be concentrated into the output load of the first charge pump circuit, whereby a more stable boosted voltage and a more stable boosted current can be supplied.

Moreover, if a clock comparing circuit is further provided which compares the first clock signal and the second clock signal to control a timing of the output selection of the buffer circuit, the cycle of the boost clock signal is prevented from being temporarily reduced, by switching between the clock signal and the frequency-divided clock signal when both of them is at "H" or "L," whereby an increase in fluctuation of the output voltage can be prevented.

DETAILED DESCRIPTION

Hereinafter, embodiments of the present disclosure will be described with reference to the accompanying drawings. Like parts are indicated by like reference symbols and will not be repeatedly described.

First Embodiment

<Configuration>

Figure 1:
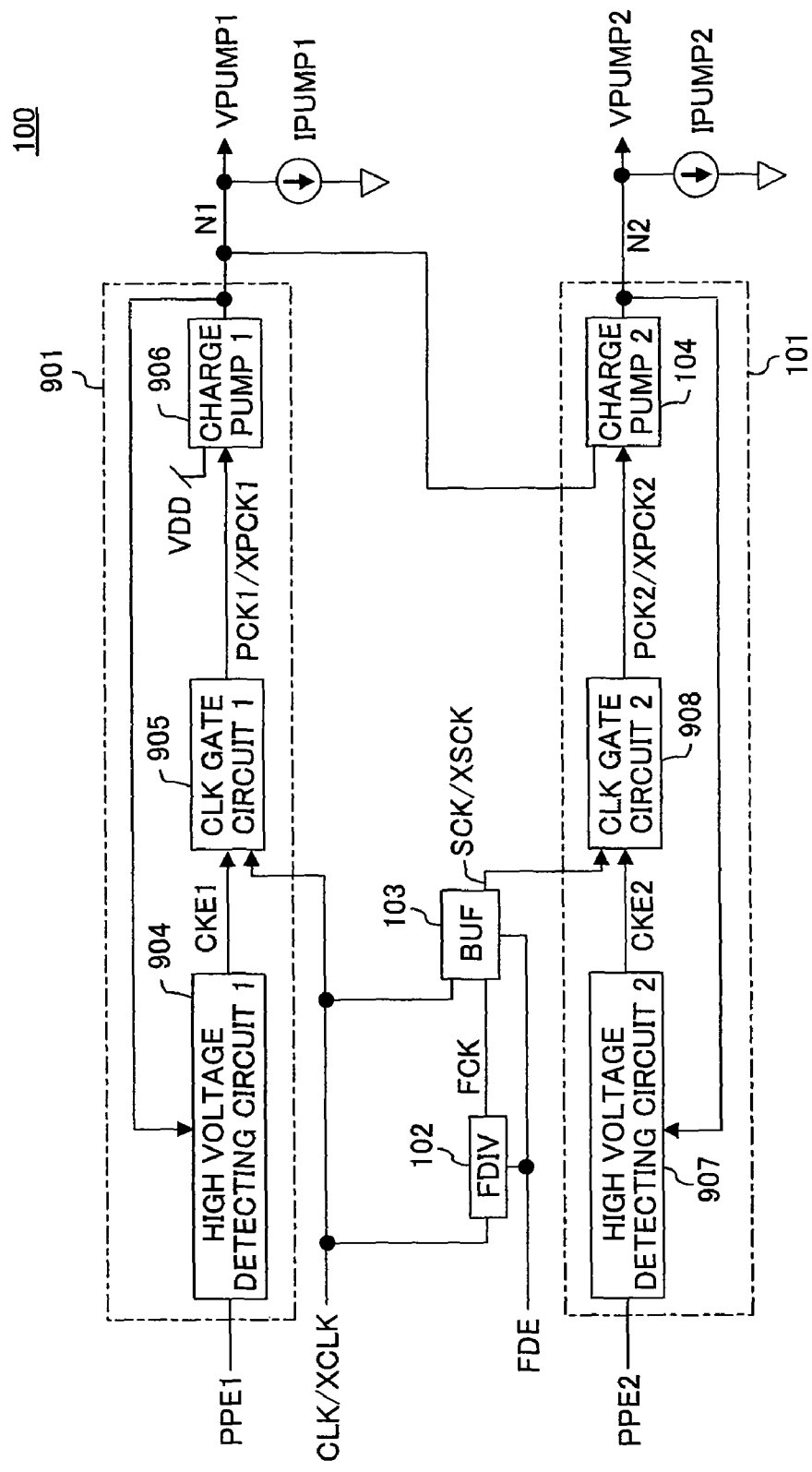
FIG. 1 is a block diagram showing a configuration of an internal voltage generating circuit according to a first embodiment of the present disclosure.

FIG. 1 shows a configuration of an internal voltage generating circuit 100 according to a first embodiment of the present disclosure. The internal voltage generating circuit 100 includes a first boost circuit 901 which is driven in accordance with a first control signal PPE1, and a second boost circuit 101 which is driven in accordance with a second control signal PPE2. The internal voltage generating circuit 100 outputs a first boosted voltage VPUMP1 through a first output node N1 of the first boost circuit 901, and outputs a second boosted voltage VPUMP2 through a second output node N2 of the second boost circuit 101. Reference symbol 102 indicates a frequency dividing circuit (FDIV) which receives a clock signal CLK having a frequency and generates a frequency-divided clock signal FCK having a frequency which is 1/N of that of the clock signal CLK (N is a natural number of two or more) in accordance with a control signal FDE. Reference symbol 103 indicates a buffer circuit (BUF) which outputs the clock signal CLK or the frequency-divided clock signal FCK as a clock signal SCK, and at the same time, outputs a clock signal XSCK complementary to the clock signal SCK, in accordance with the control signal FDE. Reference symbol 104 indicates a second charge pump circuit which receives the first boosted voltage VPUMP1 of the first boost circuit 901 as an input voltage and generates the second boosted voltage VPUMP2.

Figure 2:
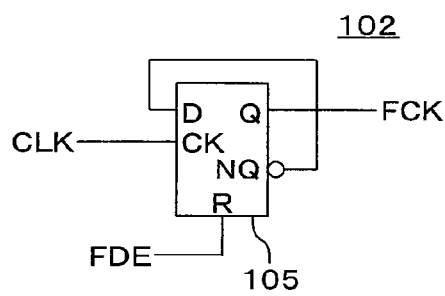
FIG. 2 is a circuit diagram showing a detailed example configuration of a frequency dividing circuit of FIG. 1.

FIG. 2 shows an example configuration of the frequency dividing circuit 102. Reference symbol 105 indicates a flip-flop circuit which transitions to the reset state and outputs "L" through a terminal Q when the control signal FDE is at "L." On the other hand, a terminal NQ is a signal terminal complementary to the terminal Q. The flip-flop 105 outputs "H" through the terminal NQ when it is in the reset state. When the control signal FDE is at "H," the flip-flop 105 inverts the logic of the terminal Q, which is triggered by a rising edge of the clock signal CLK. As a result, the flip-flop 105 outputs the frequency-divided clock signal FCK whose frequency is a half of that of the clock signal CLK. Specifically, when the frequency of the clock signal CLK is fclk, the frequency of the frequency-divided clock signal FCK is fclk/2.

Figure 3:
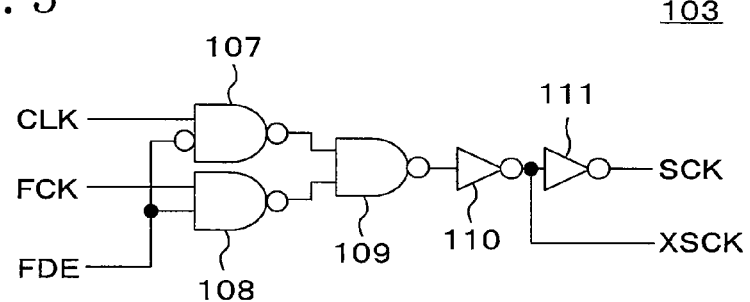
FIG. 3 is a circuit diagram showing a detailed example configuration of a buffer circuit of FIG. 1.

FIG. 3 shows an example configuration of the buffer circuit 103. Reference symbols 107 to 111 are logic elements. When FDE is at "L," the logic element 107 (one of two input logic elements) is effective, so that the clock signal CLK is selected and output as the clock signal SCK, and at the same time, the clock signal XSCK complementary to the clock signal SCK is output. When FDE is at "H," the logic element 108 (the other input logic element) is effective, so that the frequency-divided clock signal FCK is selected and output as the clock signal SCK, and at the same time, the clock signal XSCK complementary to the clock signal SCK is output.

Figure 4:
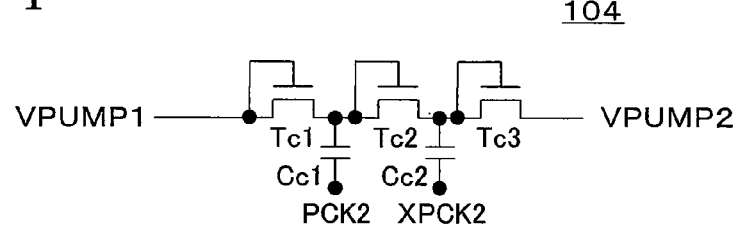
FIG. 4 is a circuit diagram showing a detailed example configuration of a second charge pump circuit of FIG. 1.

FIG. 4 shows an example configuration of the second charge pump circuit 104 (two-stages-one-parallel arrangement). Reference symbols Cc1 and Cc2 indicate boost capacitances which are boosted in accordance with second boost clock signals PCK2 and XPCK2, respectively. Reference symbols Tc1 and Tc2 indicate charge transfer transistors which have a diode-connection and transfer charge from the previous stage to the next stage. Reference symbol Tc3 indicates a backflow preventing circuit which prevents backflow of the boosted voltage VPUMP2. Here, the second charge pump circuit 104 receives the first boosted voltage VPUMP1 of a first charge pump circuit 906 as an input voltage and generates the second boosted voltage VPUMP2 which has a higher voltage level than that of the first boosted voltage VPUMP1. Specifically, the boosted voltage VPUMP2 of the second charge pump circuit 104 is represented by $$VPUMP2 = VPUMP1 + V\alpha$$

where $V\alpha$ represents an increase in voltage of the second charge pump circuit 104.

Note that the present disclosure is not limited to the frequency dividing circuit 102 of FIG. 2. Any circuit having a similar function may be employed. Moreover, the frequency dividing circuit 102 is not limited to ½ frequency division and may be 1/N frequency division (N: a natural number of two or more). A complementary clock signal may be generated by the frequency dividing circuit 102.

Moreover, the numbers of elements connected in parallel and elements connected in series in the charge pump circuits 906 and 104 are only for illustrative purposes. The present disclosure is not limited to this. Any configuration having a similar function may be employed. Moreover, although a pair of the first boost circuit 901 and the second boost circuit 101 is provided, the second boost circuit 101 may include a plurality of charge pump circuits, each of which is connected to the first output node N1. In this case, the frequency dividing circuit 102 and the buffer circuit 103 may be shared or a plurality of frequency dividing circuits 102 and a plurality of buffer circuits 103 may be provided, resulting in a similar effect.

Next, operation of the internal voltage generating circuit 100 shown in FIGS. 1 to 4 will be described with reference to FIG. 5. Here, the output voltages and output currents of the first and second charge pump circuits 906 and 104 are assumed to have the following relationships. The first boosted voltage VPUMP1 of the first charge pump circuit 906 is lower than the second boosted voltage VPUMP2 of the second charge pump circuit 104, and the current supply capability IPUMP1 of the first charge pump circuit 906 is larger than the current supply capability IPUMP2 of the second charge pump circuit 104.

(Time T0)

The circuit is in the initial state, where the first control signal PPE1 and the second control signal PPE2 are both at "L."

(Time T1)

At time T1, the first control signal PPE1 transitions from "L" to "H." In this case, the first boosted voltage VPUMP1 of the first output node N1 has not reached a first target voltage VPP1_TARGET, and therefore, a first high voltage detecting circuit 904 outputs "L" as a first sense signal CKE1. As a result, a first CLK gate circuit 905 outputs the clock signals CLK and XCLK as first boost clock signals PCK1 and XPCK1, and the first charge pump circuit 906 starts boost operation in synchronization with the first boost clock signals PCK1 and XPCK1.

Similarly, the second control signal PPE2 transitions from "L" to "H." In this case, the second boosted voltage VPUMP2 of the second output node N2 also has not reached a second target voltage VPP2_TARGET, and therefore, a second high voltage detecting circuit 907 outputs "L" as a second sense signal CKE2. Also, since the control signal FDE is at "L," the frequency dividing circuit 102 fixes the frequency-divided clock signal FCK to "L," and the buffer circuit 103 outputs the clock signal CLK as the clock signal SCK to a second CLK gate circuit 908.

As a result, the second CLK gate circuit 908 outputs the clock signals SCK and XSCK as the second boost clock signals PCK2 and XPCK2, and the second charge pump circuit 104 starts boost operation in synchronization with the second boost clock signals PCK2 and XPCK2.

(Time T2)

At time T2, the first charge pump circuit 906 receives the first boost clock signals PCK1 and XPCK1 and outputs the first boosted voltage VPUMP1 through the first output node N1, and the second charge pump circuit 104 receives the second boost clock signals PCK2 and XPCK2 and outputs the second boosted voltage VPUMP2 (=VPUMP1+Vα) through the second output node N2. A setup time until this time is substantially the same for the second boosted voltage VPUMP2 and the first boosted voltage VPUMP1.

(Time T3)

At time T3, when the first boosted voltage VPUMP1 of the first output node N1 has reached the first target voltage VPP1_TARGET, the first sense signal CKE 1 of the first high voltage detecting circuit 904 transitions from "L" to "H." As a result, the first CLK gate circuit 905 fixes the first boost clock signal PCK1 to "L" and its complementary signal XPCK1 to "H," so that the boost operation of the first charge pump circuit 906 is stopped. On the other hand, since the second boosted voltage VPUMP2 of the second output node N2 has not reached the second target voltage VPP2_TARGET, the boost operation is continued. As a result, the first charge pump circuit 906 no longer contribute to an increase in the second boosted voltage VPUMP2, i.e., the increase is attributed only to the current supply capability of the second charge pump circuit 104, resulting in a decrease in voltage increasing rate. In other words, as is similar to the conventional example, "Phase1" during which the voltage is increased without the contribution of the charge pump circuit 906 continues until time T3, and "Phase1" is transitioned to "Phase2" during which there is no contribution of the charge pump circuit 906 at time T3, and thereafter, Phase 2 continues.

(Time T4)

At time T4, the second boosted voltage VPUMP2 of the second output node N2 reaches the second target voltage VPP2_TARGET. As a result, the boost operation of the second charge pump circuit 104 is stopped. Note that the second boosted voltage VPUMP2 increases until the first target voltage VPP1_TARGET of the first boosted voltage VPUMP1 at substantially the same rate as that of the first boosted voltage VPUMP1, resulting in a reduction in setup time. Also, obviously, during the time that the second charge pump circuit 104 is stopped, the second charge pump circuit 104 does not consume charge of the first boosted voltage VPUMP1 of the first charge pump circuit 906, and therefore, charge which would otherwise be supplied to the second charge pump circuit 104 can be supplied to an output load of the first charge pump circuit 906, whereby the use efficiency of the first boost circuit 901 can be improved.

(Time T5)

At time T5, when the first boosted voltage VPUMP1 becomes lower than the first target voltage VPP1_TARGET, the first sense signal CKE1 transitions from "L" to "H," so that the boost operation of the first charge pump circuit 906 is resumed.

(Time T6)

At time T6, when the control signal FDE has transitioned from "L" to "H," the frequency dividing circuit 102 is driven to output the frequency-divided clock signal FCK whose frequency is ½ of that of the clock signal CLK. At the same time, the buffer circuit 103 switches the clock signal SCK to be supplied to the second CLK gate circuit 908 from the clock signal CLK to the frequency-divided clock signal FCK and starts outputting the clock signal SCK. As a result, the clock signals SCK and XSCK based on the frequency-divided clock signal FCK are supplied as the second boost clock signals PCK2 and XPCK2 of the second charge pump circuit 104. Therefore, after the second charge pump circuit 104 starts the boost operation, charge at the first output node N1 is no longer rapidly used. As a result, even when the boost capacitances Cc1 and Cc2 of the second charge pump circuit 104 are increased so as to reduce the setup time of the second output node N2, the potential stability of the first output node N1 can be held. Moreover, it is possible to allow the current supply capability IPUMP1 of the first charge pump circuit 906 to stably supply charge.

Thereafter, the first charge pump circuit 906 performs an intermittent operation, depending on the voltage level of the first boosted voltage VPUMP1 of the first output node N1. Similarly, the second charge pump circuit 104 performs intermittent operation, depending on the voltage level of the second boosted voltage VPUMP2 of the second output node N2. During this period of time, the second sense signal CKE2 falls at time T7, the first sense signal CKE1 falls at time T8, and the first sense signal CKE1 rises at time T9.

Note that current consumption can be reduced by synchronizing both or either of the frequency dividing circuit 102 and the buffer circuit 103 with the second sense signal CKE2 of the second high voltage detecting circuit 907.

<Effect>

As described above, the first boosted voltage VPUMP1 of the first charge pump circuit 906 is used as an input voltage to the second charge pump circuit 104 having a small current supply capability, and the charge pump circuits 906 and 104 are controlled using the separate high voltage detecting circuits 904 and 907, respectively, and moreover, the boost clock signal to be supplied to the second charge pump circuit 104 is divided, whereby the setup time of the second charge pump circuit 104 can be reduced. In addition, after setting up, current supply can be concentrated into the output load of the first charge pump circuit 906, and even when the second charge pump circuit 104 is operated, the frequency of the boost clock signal is set to be low. Therefore, the fluctuation of the output voltage of the first charge pump circuit 906 can be suppressed, resulting in a more stable boosted voltage and a more stable supply of a boost current.

Second Embodiment

Figure 7:
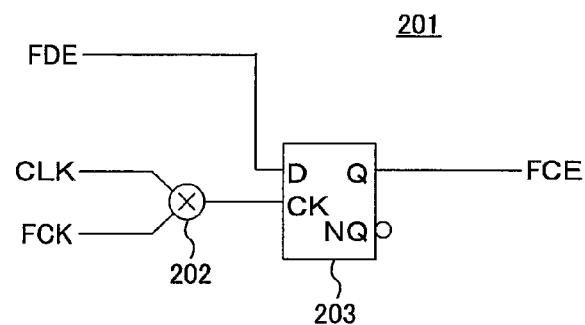
FIG. 7 is a circuit diagram showing a detailed example configuration of a clock comparing circuit of FIG. 6.
Figure 6:
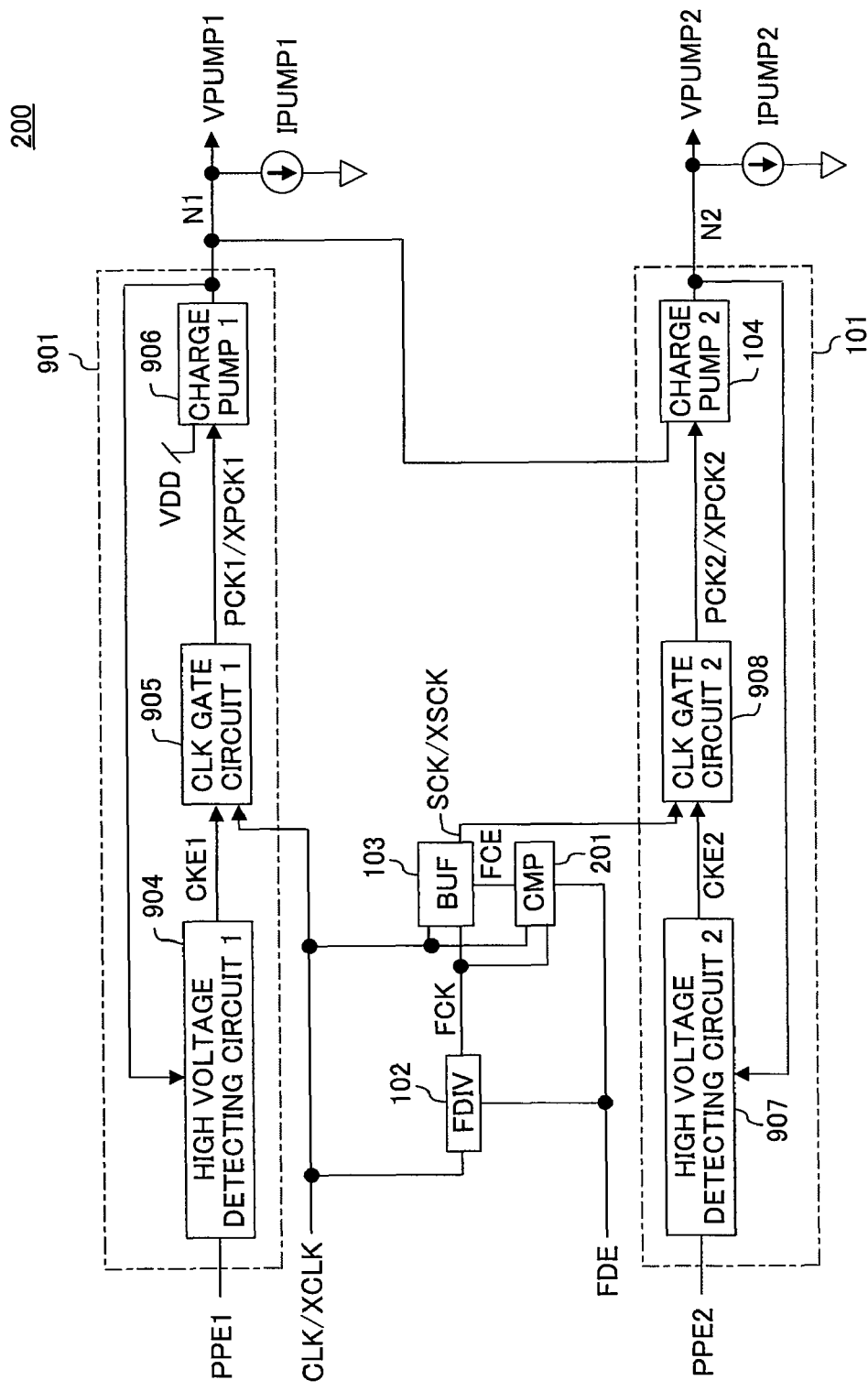
FIG. 6 is a block diagram showing a configuration of an internal voltage generating circuit according to a second embodiment of the present disclosure.

FIG. 6 shows an internal voltage generating circuit 200 according to a second embodiment which is different from the internal voltage generating circuit 100 of the first embodiment of FIG. 1 in that the buffer circuit 103 is controlled by a clock comparing circuit (CMP) 201 which compares the clock signal CLK and the frequency-divided clock signal FCK and generates a new control signal FCE. Referring to FIG. 7, in the clock comparing circuit 201, when the clock signal CLK and the frequency-divided clock signal FCK are both at "H," the output of the operational circuit 202 is at "H" and is input to a clock terminal of a latch circuit 203, which in turn outputs the control signal FDE (="H") received as a data signal as the new control signal FCE through a terminal Q. As a result, the buffer circuit 103 switches the clock signal SCK between the clock signal CLK and the frequency-divided clock signal FCK.

Figure 5:
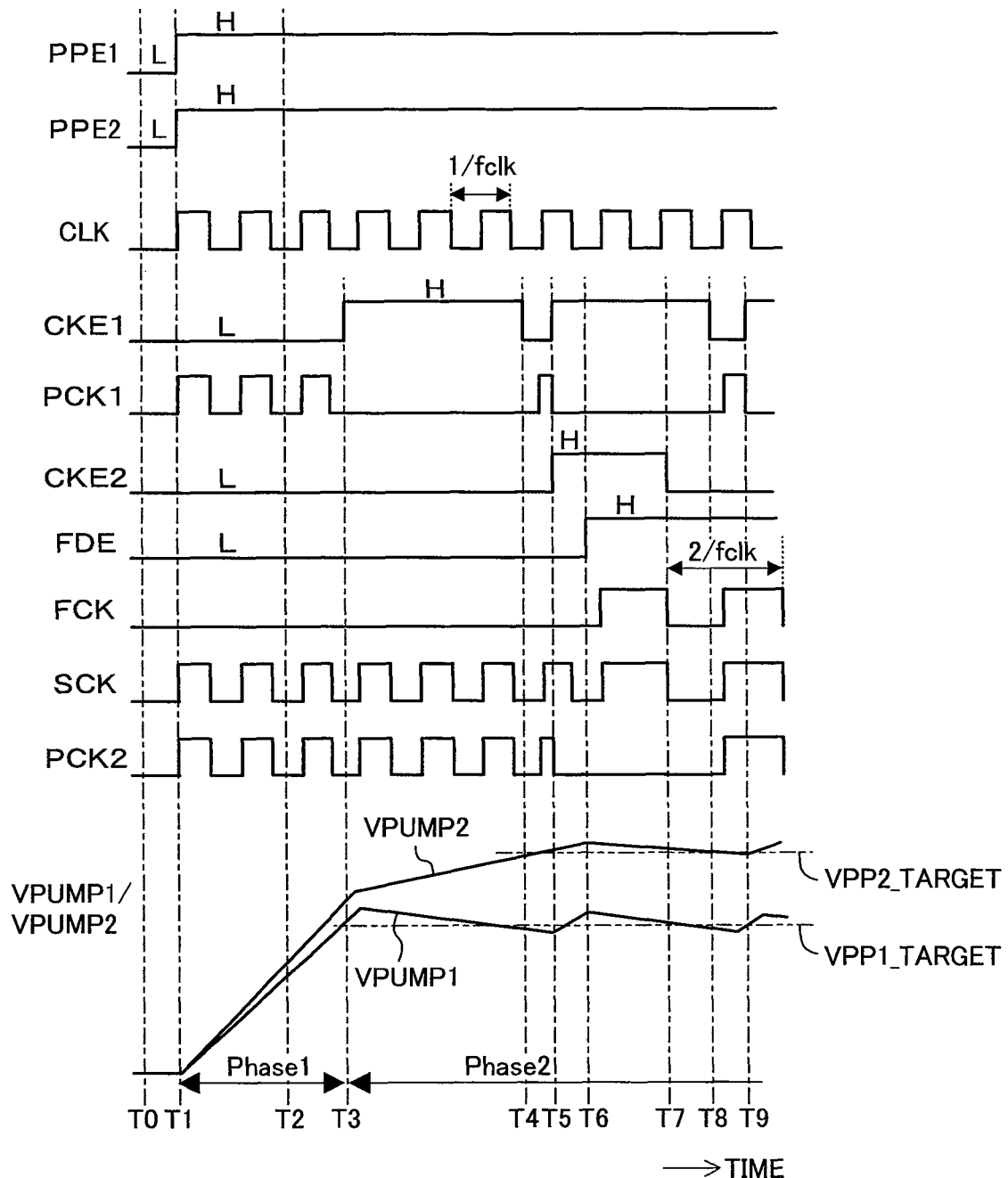
FIG. 5 is a timing diagram showing operation of the internal voltage generating circuit of FIG. 1.
Figure 8:
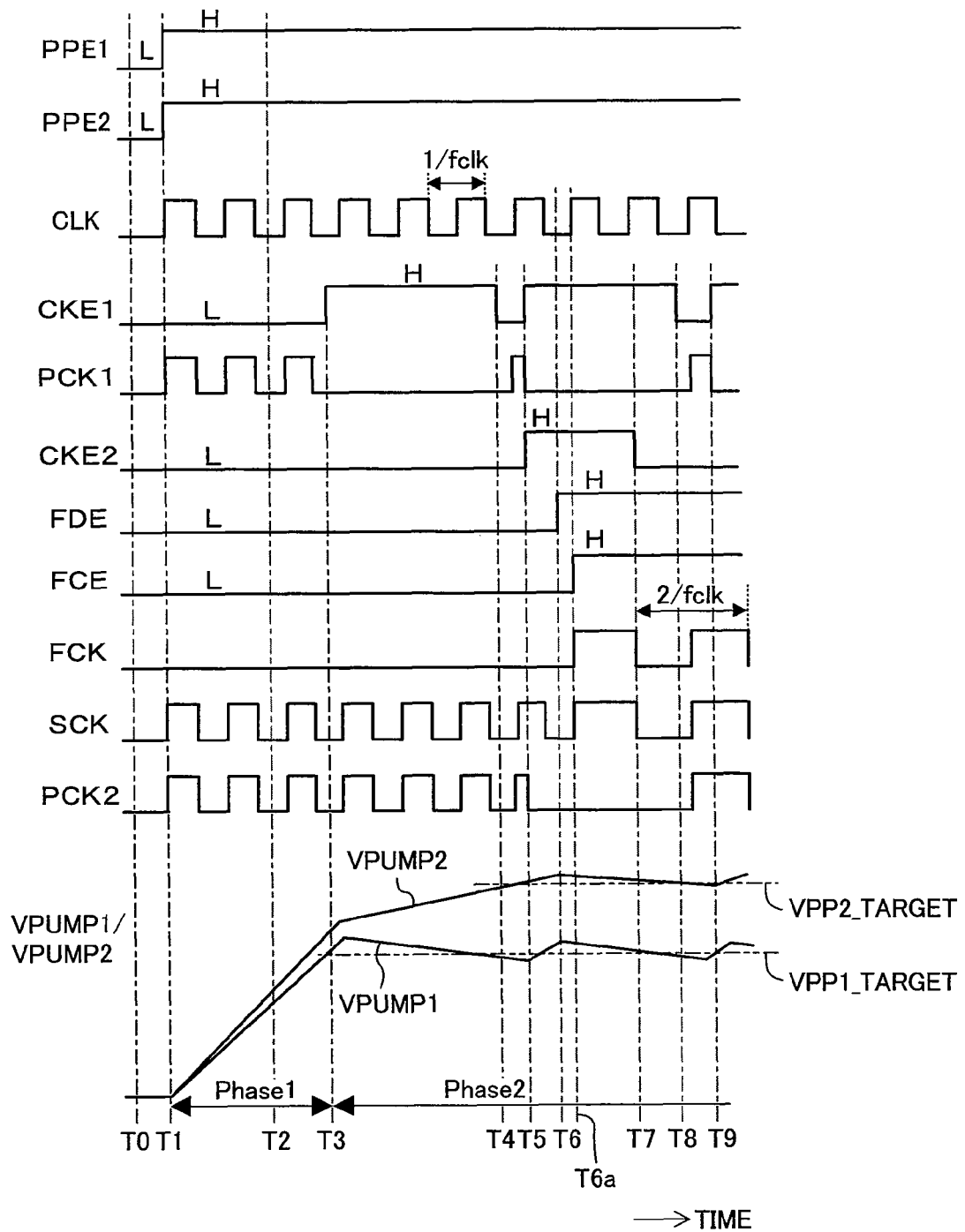
FIG. 8 is a timing diagram showing operation of the internal voltage generating circuit of FIG. 6.
Figure 9:
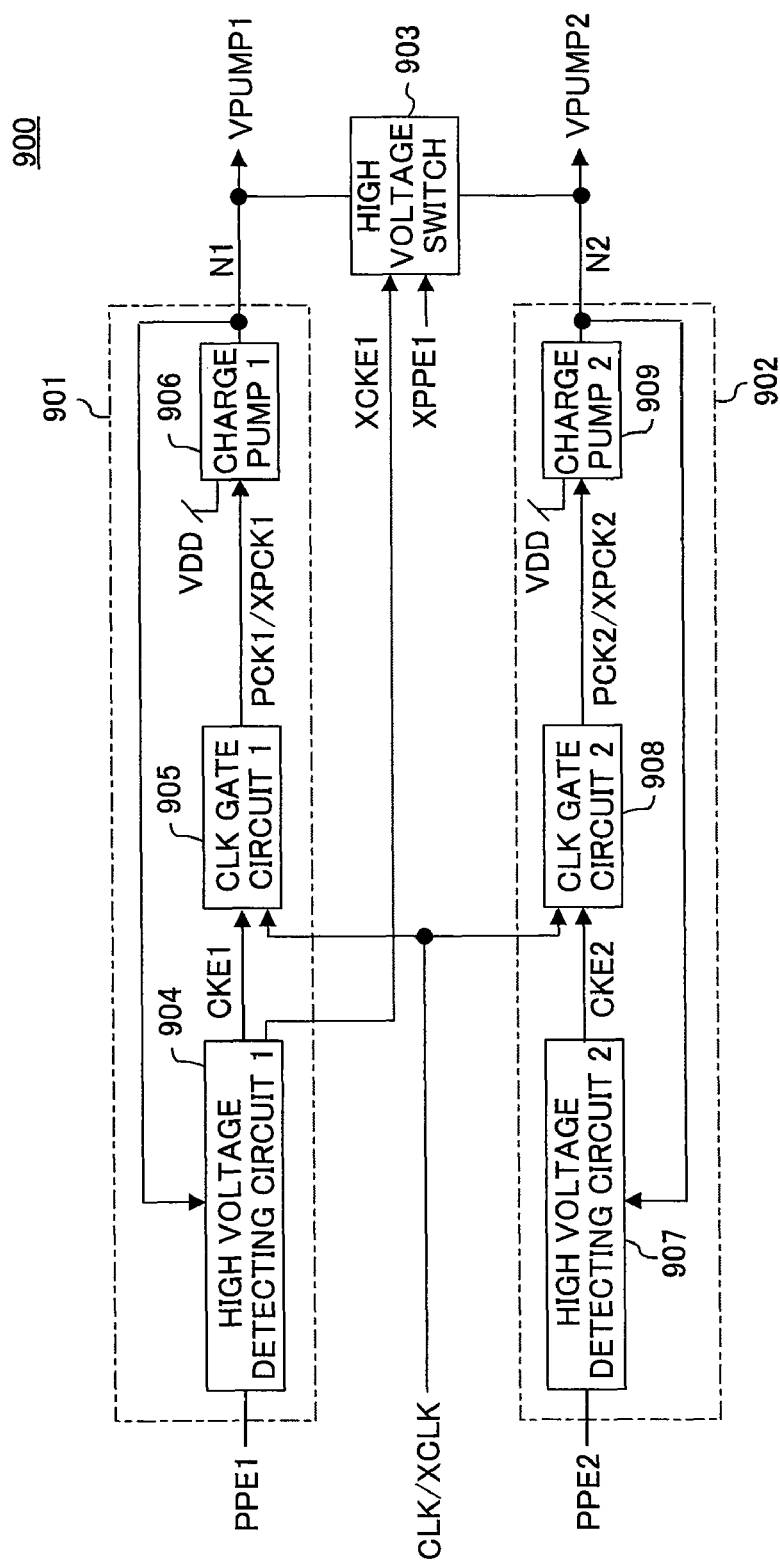
FIG. 9 is a block diagram showing a configuration of an example conventional internal voltage generating circuit.
Figure 10:
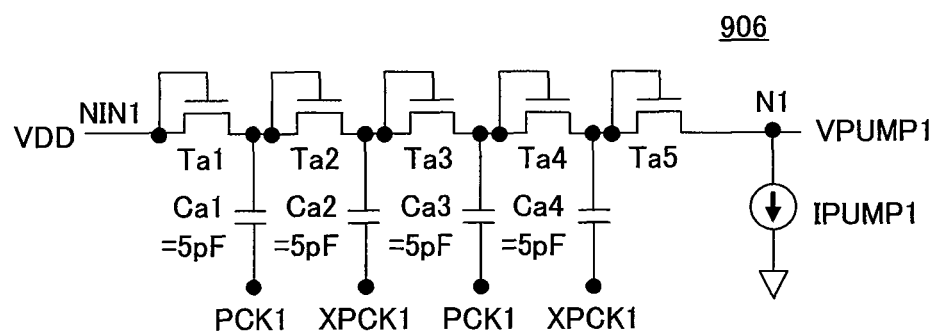
FIG. 10 is a circuit diagram showing a detailed example configuration of a first charge pump circuit of FIG. 9.
Figure 11:
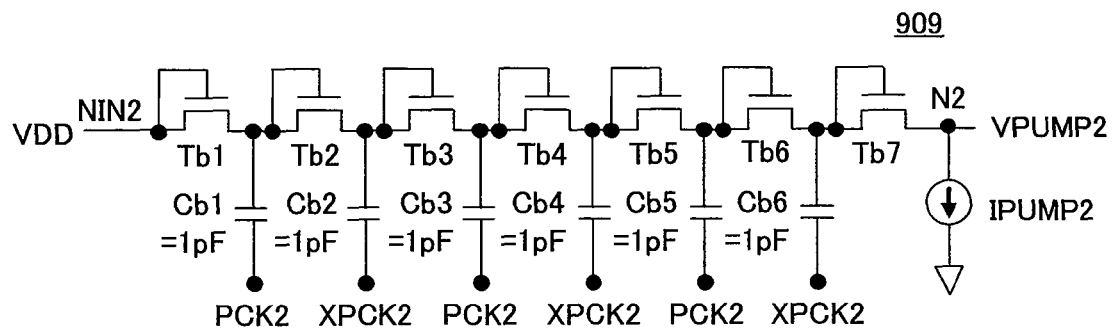
FIG. 11 is a circuit diagram showing a detailed example configuration of a second charge pump circuit of FIG. 9.
Figure 12:
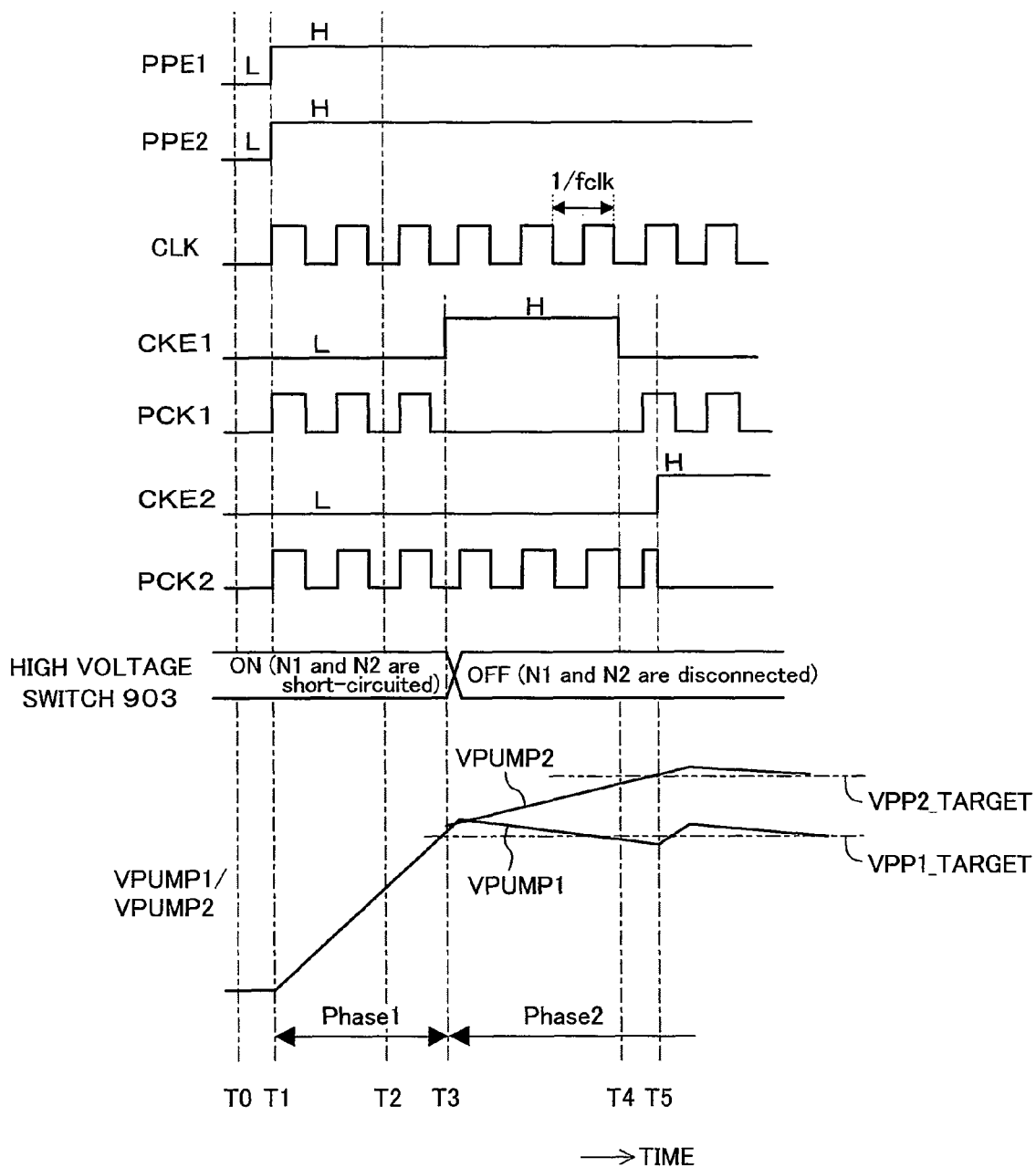
FIG. 12 is a timing diagram showing operation of the internal voltage generating circuit of FIG. 9.

FIG. 8 is a timing diagram which is obtained by adding time T6a to FIG. 5. At time T6, although the logic of the control signal FDE transitions, since the clock signal CLK and the frequency-divided clock signal FCK are both at "L," the new control signal FCE remains at "L." At time T6a, both the clock signal CLK and the frequency-divided clock signal FCK transition to "H," so that the control signal FDE (="H") becomes effective and the logic of the new control signal FCE transitions, and the buffer circuit 103 outputs the clock signals SCK and XSCK to the second CLK gate circuit 908 based on the frequency-divided clock signal FCK.

Note that if all or any of the frequency dividing circuit 102, the buffer circuit 103 and the clock comparing circuit 201 are operated in synchronization with the second sense signal CKE2 of the second high voltage detecting circuit 907, current consumption can be reduced.

Thus, by switching between the clock signal CLK and the frequency-divided clock signal FCK when both of them are at "H" or "L," it is possible to prevent the cycle of the clock signals SCK and XSCK to the second CLK gate circuit 908 from being temporarily decreased, whereby an increase in fluctuation of the output voltage can be prevented.

Although it has been assumed in the embodiments above that the single-phase clock signals CLK and XCLK are employed, it is clear that if a plurality of first and second charge pump circuits 906 and 104 are arranged in parallel, then when a multi-phase clock signal is supplied to the respective corresponding charge pump circuits, a similar function and effect can be obtained.

The internal voltage generating circuit of the present disclosure is useful as, for example, a power source generating circuit for a non-volatile semiconductor memory device. The internal voltage generating circuit of the present disclosure can also be used in applications, such as power source circuits for a volatile semiconductor memory device (e.g., a DRAM, etc.), a liquid crystal device, a mobile device and the like.

Although the preferable embodiments of the present disclosure have been described above, the present disclosure is not limited to those. Various changes and modifications can be made.

What is claimed is:

1. An internal voltage generating circuit comprising:
a first boost circuit provided between a first voltage and a first terminal;
a second boost circuit provided between the first terminal and a second terminal;
a frequency dividing circuit configured to divide a first clock signal to be supplied to the first boost circuit to generate a second clock signal; and
a buffer circuit configured to select and supply the first clock signal or the second clock signal to the second boost circuit.

2. The internal voltage generating circuit of claim 1, further comprising:
a clock comparing circuit configured to compare the first clock signal and the second clock signal to output a control signal to the buffer circuit.

3. An internal voltage generating circuit comprising:
a first charge pump circuit configured to generate a second voltage from a first voltage;
a second charge pump circuit configured to generate a third voltage from the second voltage;
a frequency dividing circuit configured to divide a first clock signal to generate a second clock signal; and
a buffer circuit configured to select the first clock signal or the second clock signal and generate a third clock signal,
wherein the third clock signal is supplied to the second charge pump circuit.

4. The internal voltage generating circuit of claim 3, wherein
a clock signal having substantially the same frequency as that of the first clock signal is supplied to the first charge pump circuit.

5. The internal voltage generating circuit of claim 3, further comprising:
a comparison circuit configured to output a first control signal in accordance with on the first clock signal and the second clock signal,
wherein the buffer circuit is controlled in accordance with the first control signal.

6. An internal voltage generating circuit comprising:
a first charge pump circuit configured to generate a second voltage from a first voltage; and
a second charge pump circuit configured to generate a third voltage from the second voltage,
wherein a frequency of a clock signal to be su shied to the second charge pump circuit is changed in accordance with a control signal, and
the frequency of the clock signal to be supplied to the second charge pump circuit is changed to a frequency which is obtained by dividing an original frequency.

7. An internal voltage generating circuit comprising:
a first charge pump circuit configured to generate a second voltage from a first voltage; and
a second charge pump circuit configured to generate a third voltage from the second voltage,
wherein a length of a period in which a clock signal to be supplied to the second charge pump circuit is in a high state is changed in accordance with a control signal.

8. The internal voltage generating circuit of claim 7, wherein the length of a period in which the clock signal to be supplied to the second charge pump circuit is in a high state is changed to a frequency which is obtained by dividing an original frequency.

* * * * *